United States Patent
Takahara

(10) Patent No.: US 8,198,959 B2
(45) Date of Patent: Jun. 12, 2012

(54) ACOUSTIC WAVE FILTER DEVICE

(75) Inventor: Seiichi Takahara, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 251 days.

(21) Appl. No.: 12/727,294

(22) Filed: Mar. 19, 2010

(65) Prior Publication Data

US 2010/0164647 A1 Jul. 1, 2010

Related U.S. Application Data

(63) Continuation of application No. PCT/JP2008/063987, filed on Aug. 5, 2008.

(30) Foreign Application Priority Data

Oct. 1, 2007 (JP) .................................. 2007-257092

(51) Int. Cl.
*H03H 9/64* (2006.01)
(52) U.S. Cl. ...................... 333/195; 333/193; 310/313 D
(58) Field of Classification Search .......... 333/193–196, 333/133; 310/313 B, 313 D
See application file for complete search history.

(56) References Cited

U.S. PATENT DOCUMENTS

| | | | | |
|---|---|---|---|---|
| 5,790,000 | A * | 8/1998 | Dai et al. ....................... | 333/193 |
| 6,081,172 | A * | 6/2000 | Strauss et al. .................. | 333/193 |
| 6,353,372 | B1 | 3/2002 | Baier et al. | |
| 6,940,368 | B2 * | 9/2005 | Plessky et al. ................. | 333/193 |
| 2004/0080383 | A1 * | 4/2004 | Takamine ...................... | 333/194 |
| 2005/0057323 | A1 | 3/2005 | Kando | |
| 2005/0212620 | A1 | 9/2005 | Bauer et al. | |
| 2006/0097824 | A1 | 5/2006 | Detlefsen et al. | |
| 2009/0289745 | A1 * | 11/2009 | Bauer et al. ................... | 333/195 |

FOREIGN PATENT DOCUMENTS

| | | |
|---|---|---|
| DE | 198 18 038 A1 | 11/1999 |
| EP | 0 988 697 B1 | 3/2000 |
| EP | 1 394 941 A2 | 3/2004 |
| JP | 2001-308672 A | 11/2001 |
| JP | 2002-503414 A | 1/2002 |
| JP | 2003-23341 A | 1/2003 |
| JP | 2004-96244 A | 3/2004 |
| JP | 2004-159262 A | 6/2004 |
| JP | 2005-521319 A | 7/2005 |
| JP | 2006-514460 A | 4/2006 |
| WO | 98/57428 A1 | 12/1998 |

OTHER PUBLICATIONS

Official Communication issued in International Patent Application No. PCT/JP2008/063987, mailed on Oct. 21, 2008.

* cited by examiner

*Primary Examiner* — Barbara Summons
(74) *Attorney, Agent, or Firm* — Keating & Bennett, LLP

(57) ABSTRACT

An acoustic wave filter device including a balanced-unbalanced conversion function in which balancing between signals transmitted to first and second balanced terminals is improved includes a longitudinally-coupled resonator type acoustic wave filter unit including an unbalanced end and first and second balanced ends and an acoustic wave resonator. First and second divided electrode sections included in an IDT are respectively connected to first and second signal lines which are connected to the first and second balanced ends of the acoustic wave filter unit. A length of a line which connects the first divided electrode section to the first balanced end is equal or substantially equal to a length of a line which connects the second divided electrode section to the second balanced end, and the first divided electrode section is different from the second divided electrode section.

33 Claims, 11 Drawing Sheets

ACOUSTIC WAVE FILTER DEVICE

BACKGROUND OF THE INVENTION

1. Field of the Invention

The present invention relates to an acoustic wave filter device having balanced-unbalanced conversion functions, and particularly relates to an acoustic wave filter device in which a single-port acoustic wave resonator is connected to a longitudinally-coupled resonator type acoustic wave filter unit.

2. Description of the Related Art

In general, a band filter including a balanced-unbalanced conversion function is required for an RF stage of a cellular phone, for example. As such a band filter, a surface acoustic wave filter device having a balanced-unbalanced conversion function is generally used.

In Japanese Unexamined Patent Application Publication No. 2001-308672 below, for example, a surface acoustic wave filter device having an electrode configuration as shown in FIG. 13 is disclosed. In a surface acoustic wave filter device 1001, an electrode configuration shown in FIG. 13 is connected between an unbalanced terminal 1002 and first and second balanced terminals 1003 and 1004. A single-port surface acoustic wave resonator 1005 is connected to the unbalanced terminal 1002. A second terminal of the surface acoustic wave resonator 1005 is connected to first and second longitudinally-coupled resonator type surface acoustic wave filters 1006 and 1007. Both of the surface acoustic filters 1006 and 1007 are 3-IDT longitudinally-coupled resonator type surface acoustic wave filters.

IDT electrodes located at the middle of the surface acoustic wave filters 1006 and 1007 are connected to each other and further connected to the surface acoustic wave resonator 1005. On the other hand, IDT electrodes arranged so that the middle IDT electrode of the surface acoustic filter 1006 is sandwiched between the IDT electrodes are connected to each other and further connected to the first balanced terminal 1003 through a single-port surface acoustic wave resonator 1008. Similarly, IDT electrodes arranged so that the middle IDT electrode of the surface acoustic filter 1007 is sandwiched between the IDT electrodes are connected to each other and further connected to the second balanced terminal 1004 through a SAW resonator 1009. Note that the surface acoustic wave filters 1006 and 1007 are configured such that a phase of a signal transmitted through a first signal line 1010 which connects the surface acoustic filter 1006 to the first balanced terminal 1003 is shifted by 180 degrees relative to a phase of a signal transmitted through a second signal line 1011 which connects the surface acoustic filter 1007 to the second balanced terminal 1004.

Furthermore, a surface acoustic wave resonator 1012 is connected between the first and second signal lines 1010 and 1011. Specifically, the single-port surface acoustic wave resonator 1012 has a first bus bar connected to the first signal line 1010 and a second bus bar connected to the second signal line 1011.

A resonant frequency of the single-port surface acoustic wave resonator 1012 is set in a lower side of pass bands of the surface acoustic wave filters 1006 and 1007, and accordingly, an out-of-band attenuation amount is increased. Furthermore, according to Japanese Unexamined Patent Application Publication No. 2001-308672, the surface acoustic wave resonator 1012 is used to connect the first and second signal lines 1010 and 1011 to each other, the same influence is applied to the balanced terminals 1003 and 1004. Accordingly, deterioration of balancing can be suppressed.

On the other hand, according to Japanese Unexamined Patent Application Publication No. 2004-96244, a reactance component is added to one of first and second balanced terminals included in a surface acoustic wave filter device having a balanced-unbalanced conversion function. By adding the reactance component, phase balancing is improved. In FIG. 19 of Japanese Unexamined Patent Application Publication No. 2004-96244, comb-shaped electrodes are employed in a configuration to add the reactance component. That is, capacitance of the comb-shaped electrodes makes it possible to add the reactance component to one of the balanced terminals.

According to the surface acoustic wave filter device 1001 of Japanese Unexamined Patent Application Publication No. 2001-308672, since the surface acoustic wave resonator 1012 is connected, the out-of-band attenuation amount is increased. However, among the first and second bus bars of the surface acoustic wave resonator 1012 which are located at opposite sides relative to the surface acoustic wave resonator 1012, the first bus bar is connected to the first signal line 1010 and the second bus bar is connected to the second signal line 1011. That is, since lines extend from the first and second bus bars, a wiring configuration on a piezoelectric substrate is likely to be complicated. Therefore, it is difficult to enhance miniaturization. Furthermore, as described above, since substantially the same influence of the connection of the surface acoustic wave resonator 1012 is applied to the first and second balanced terminals 1003 and 1004, balancing is not considerably deteriorated. However, this configuration does not positively improve the balancing. Accordingly, in the configuration disclosed in Japanese Unexamined Patent Application Publication No. 2001-308672, balancing between signals transmitted to the first and second balanced terminals 1003 and 1004 is not improved.

On the other hand, in the configuration disclosed in Japanese Unexamined Patent Application Publication No. 2004-96244, the reactance component is added to one of the balanced terminals since the configuration including the comb-shaped electrodes is employed. Therefore, phase balancing is improved. However, although the balancing is improved, there arises a problem in that insertion loss is increased due to an increase of parasitic capacitance caused by the addition of the reactance component. Furthermore, since the reactance component is added, an area of electrodes in a piezoelectric substrate is increased, and therefore, a surface acoustic wave filter chip becomes large.

SUMMARY OF THE INVENTION

In order to overcome the disadvantages of the related art described above, preferred embodiments of the present invention provide an acoustic wave filter device which has a balanced-unbalanced conversion function and which is capable of enhancing an out-of-band attenuation amount and balancing between signals transmitted to first and second balanced terminals.

According to a preferred embodiment of the present invention, a longitudinally-coupled resonator type acoustic wave filter device includes an unbalanced terminal and first and second balanced terminals and has a balanced-unbalanced conversion function. The acoustic wave filter device includes a piezoelectric substrate, a longitudinally-coupled resonator type acoustic wave filter unit which is disposed on the piezoelectric substrate and which includes an unbalanced end connected to the unbalanced terminal and first and second balanced ends which output respective signals having phases different from each other by 180 degrees, an acoustic wave resonator which is disposed on the piezoelectric substrate and which includes an IDT electrode having first and second bus bars which oppose each other and a pair of reflectors disposed so that the IDT electrode is sandwiched between the reflectors in an acoustic wave propagation direction, and first and second signal lines having first ends connected to the first and second balanced ends of the acoustic wave filter unit, respectively, and second terminals connected to the first and second balanced terminals, respectively. The acoustic wave resonator includes first and second divided electrode sections obtained by dividing the first bus bar of the IDT electrode of the acoustic wave resonator into two, and the first and second divided electrode sections are connected to each other in series in the acoustic wave propagation direction by the second bus bar. One terminal of the first divided electrode section which is arranged opposite to the second bus bar is connected to the first signal line. One terminal of the second divided electrode section which is arranged opposite to the second bus bar is connected to the second signal line. A length of a line which connects the first divided electrode section to the first balanced end is equal or substantially equal to a length of a line which connects the second divided electrode section to the second balancing end, and the first electrode section is different from the second divided electrode section.

In an acoustic wave filter device according to a preferred embodiment of the present invention, the longitudinally-coupled resonator type acoustic wave filter unit can be appropriately modified. According to a preferred embodiment of the present invention, the longitudinally-coupled resonator type acoustic wave filter unit includes three or more odd number of IDT electrodes which are arranged on the piezoelectric substrate in the acoustic wave propagation direction, among the odd number of IDT electrodes, an IDT electrode arranged in the middle in the acoustic wave propagation direction includes first and second divided IDT sections which are obtained by dividing the IDT electrode into two in the acoustic wave propagation direction, the first and second divided IDT sections include the first and second balanced ends, respectively, two IDT electrodes arranged so that the IDT electrode in the middle is sandwiched between the two IDT electrodes in the acoustic wave propagation direction includes unbalanced ends connected to the unbalanced terminal.

Furthermore, the longitudinally-coupled resonator type acoustic wave filter unit includes three or more odd number of IDT electrodes arranged on the piezoelectric substrate in the acoustic wave propagation direction, among the odd number of IDT electrodes, an IDT electrode arranged in the middle in the acoustic wave propagation direction is connected to the unbalanced terminal, and IDT electrodes arranged so that the IDT electrode arranged in the middle is sandwiched between the IDT electrodes are connected to the first and second balanced terminals, respectively.

According to another preferred embodiment of the present invention, a longitudinally-coupled acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction. One terminal of an IDT electrode arranged in the middle among the odd number of IDT electrodes included in the first acoustic wave filter unit corresponds to the unbalanced end or the first balanced end, and one end of an IDT electrode and one end of another IDT electrode, the IDT electrodes being arranged so that the IDT electrode arranged in the middle is sandwiched between the IDT electrodes, correspond to the first balanced end or the unbalanced end. One terminal of an IDT electrode arranged in the middle in the acoustic wave propagation direction among the odd number of IDT electrodes included in the second acoustic wave filter unit corresponds to the unbalanced end or the second balanced end, and one end of an IDT electrode and one end of another IDT electrode, the IDT electrodes being arranged so that the IDT electrode arranged in the middle is sandwiched between the IDT electrodes, correspond to the second balanced end or the unbalanced end.

According to still another preferred embodiment of the present invention, a longitudinally-coupled resonator type acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction. The first and second acoustic wave filter units are arranged so as to be perpendicular or substantially perpendicular to the acoustic wave propagation direction of the acoustic wave filter units and are connected to each other in two-stage cascade connection. When both sides of each of IDT electrodes arranged in the middle of the first and second acoustic wave filter units are determined to be a first side and a second side, one terminal of an IDT adjacent to the first side of the IDT electrode in the middle of the first acoustic wave filter unit is connected through the first signal line to one terminal of an IDT adjacent to the first side of the second acoustic wave filter unit in the acoustic wave propagation direction. One end of an IDT adjacent to the second side of the IDT electrode arranged in the middle of the first acoustic wave filter unit is connected through the second signal line to one terminal of an IDT electrode adjacent to the second side of the IDT electrode arranged in the middle of the second acoustic wave filter unit. A phase of an electric signal transmitted through the first signal line is different from a phase of an electric signal transmitted through the second signal line. One terminal of the IDT electrode arranged in the middle of the first acoustic wave filter unit corresponds to the unbalanced end, one terminal of an IDT and one terminal of another IDT, the IDTs being arranged so that the IDT electrode in the middle is sandwiched between the IDTs in the acoustic wave propagation direction, correspond to the first and second balanced ends, and the first and second balanced ends and the first and second balanced terminals are connected to each other through the second acoustic wave filter unit using the first and second signal lines, respectively.

In this case, the acoustic wave resonator may be connected to the first and second signal lines in a stage subsequent to the second acoustic weave filter unit. Furthermore, the acoustic wave resonator may be connected to the first and second signal lines in a stage followed by a stage of the second acoustic wave filter unit and between the first and second acoustic wave filter units.

Furthermore, although the first and second divided electrode sections included in the acoustic wave resonator are different from each other in the acoustic wave filter device according to a preferred embodiment of the present invention, a configuration in this case is not particularly limited. That is, the number of electrode fingers included in the first divided electrode section may be different from the number of electrode fingers included in the second divided electrode section. In this case, since the numbers of electrode fingers are different from each other, the first and second divided electrode sections are easily made different from each other. Accordingly, balancing is improved.

Furthermore, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode may be determined to be an electrode finger connected to a hot potential, and the number of electrode fingers included in the first divided electrode section may be larger than the number of electrode fingers included in the second divided electrode section. Also in this case, the balancing is improved.

Alternatively, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode may be determined to be an electrode finger connected to a ground potential, and the number of electrode fingers included in the first divided electrode section may be smaller than the number of electrode fingers included in the second divided electrode section.

Furthermore, a metallization ratio of the first divided electrode section may be different from a metallization ratio of the second divided electrode section. In this case, since the metallization ratios are made different from each other when the electrodes are formed, the balancing is improved according to various preferred embodiments of the present invention.

Furthermore, an electrode finger pitch of the first divided electrode section may be different from an electrode finger pitch of the second divided electrode section. Also in this case, since the electrode finger pitches are different from each other, the balancing is easily improved.

Moreover, in the acoustic wave filter device according to a preferred embodiment of the present invention, the second bus bar of the acoustic wave resonator may be connected to the ground potential. Also in this case, the balancing is improved.

Furthermore, a band between a resonant frequency and an antiresonant frequency may include a passband of the longitudinally-coupled resonator type acoustic wave filter unit. Since the surface acoustic wave resonator has an induction property in the band between a resonant frequency and an antiresonant frequency, the acoustic wave resonator does not have a capacitive property in the passband of the longitudinally-coupled resonator type acoustic wave filter unit. Accordingly, deterioration of an insertion loss can be prevented.

An acoustic wave filter device according to a preferred embodiment of the present invention may use surface acoustic waves. In this case, according to a preferred embodiment of the present invention, a longitudinally-coupled resonator type surface acoustic wave filter device is obtained. Alternatively, acoustic boundary waves may be used. In this case, according to a preferred embodiment of the present invention, a longitudinally-coupled resonator type acoustic boundary wave filter device is obtained.

In the acoustic wave filter device according to a preferred embodiment of the present invention, since a length of a line which connects the first divided electrode section of the acoustic wave resonator to the first balanced end is equal or substantially equal to a length of a line which connects the second divided electrode section to the second balanced end, an amount of a shift of a phase of a signal transmitted from the first signal line to the acoustic wave resonator is substantially equal to an amount of a shift of a phase of a signal transmitted from the second signal line to the acoustic wave resonator. Accordingly, phase balancing and amplitude balancing between the first and second balanced terminals are efficiently improved.

In addition, since the first and second divided electrode sections of the acoustic wave resonator are different from each other, the amplitude balancing and the phase balancing between signals of the first and second balanced terminals can be specifically controlled by controlling the difference between the first and second divided electrode sections. Accordingly, the balancing is further improved.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention will become apparent from detailed description of preferred embodiments described with reference to the accompanying drawings hereinafter.

Figure 1:
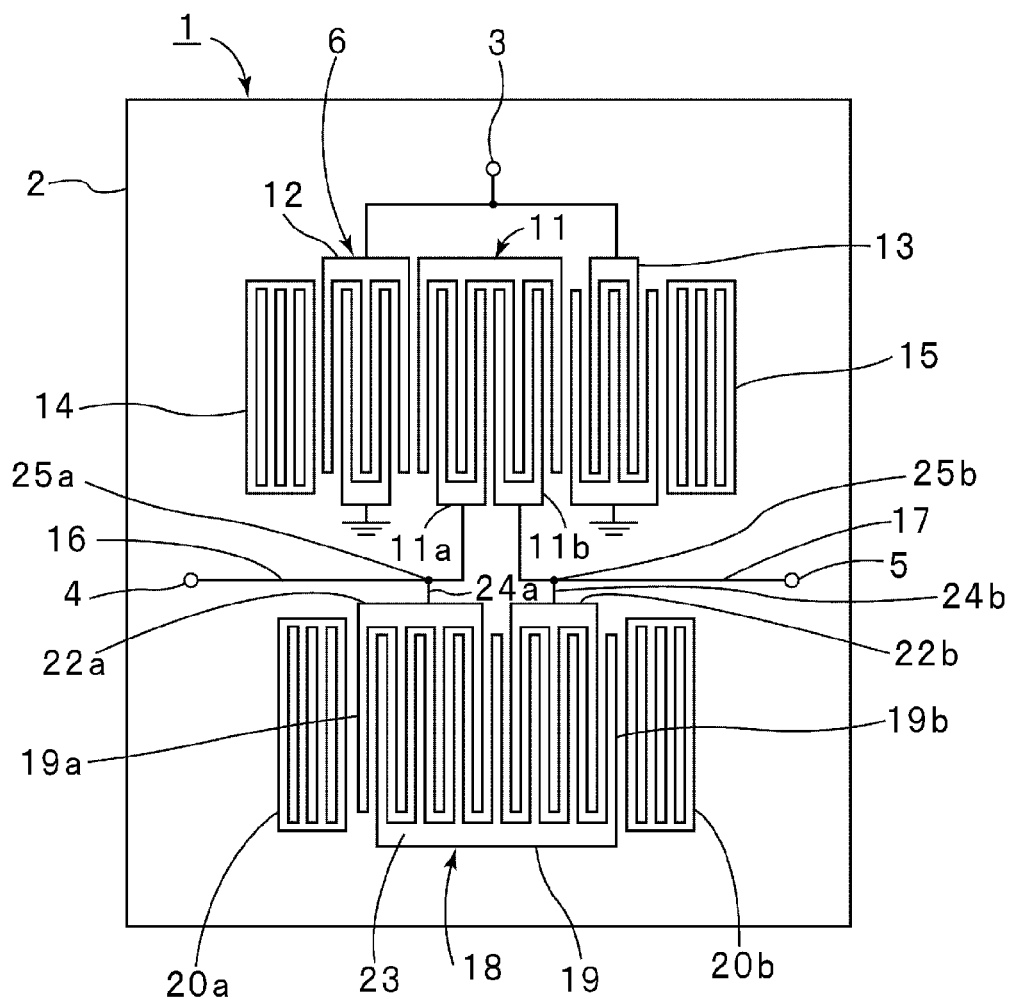
FIG. 1 is a plan view schematically illustrating an acoustic wave filter device according to a first preferred embodiment of the present invention.

FIG. 1 is a plan view schematically illustrating an electrode configuration of an acoustic wave filter device according to a first preferred embodiment of the present invention. An acoustic wave filter device 1 of this preferred embodiment preferably is a surface acoustic wave filter utilizing surface acoustic waves.

The electrode configuration schematically illustrated in FIG. 1 is formed on a piezoelectric substrate 2. In this preferred embodiment, the piezoelectric substrate 2 is preferably formed of a LiTaO₃ substrate. More specifically, a LiTaO₃ monocrystalline substrate having a surface wave propagation direction of a crystal axis corresponding to the X direction, and a cutting angle of a Y rotation angle of 40±5 degrees is used. Note that the piezoelectric substrate 2 may be formed of LiTaO₃ having another crystal orientation or another piezoelectric monocrystalline. Furthermore, the piezoelectric substrate 2 may be formed of a piezoelectric ceramic.

The electrode configuration shown in FIG. 1 preferably is formed of a laminated layer including a Ti layer having a thickness of about 10 nm and an Al layer having a thickness of about 317 nm, for example, which are laminated on the piezoelectric substrate 2.

In the acoustic wave filter device 1, a longitudinally-coupled resonator type acoustic wave filter unit 6 is connected between an unbalanced terminal 3 and first and second balanced terminals 4 and 5. The longitudinally-coupled resonator type acoustic wave filter unit 6 includes a first IDT electrode 11 arranged in the middle, second and third IDT electrodes 12 and 13 arranged so that the first IDT electrode 11 is sandwiched between the second and third IDT electrodes 12 and 13 in a propagation direction. A region including the IDT electrodes 11 to 13 is sandwiched between reflectors 14 and 15 in the surface acoustic wave propagation direction. That is, the longitudinally-coupled resonator type acoustic wave filter unit 6 is a 3-IDT longitudinally coupled resonator type surface acoustic wave filter.

A first terminal of the second IDT electrode 12 and a first terminal of the third IDT electrode 13 are connected to each other, and further electrically connected to the unbalanced terminal 3. A second terminal of the second IDT electrode 12 and a second terminal of the third IDT electrode 13 are connected to the ground potential. The first IDT electrode 11 includes first and second divided IDT electrode sections 11a and 11b which are obtained by dividing the IDT electrode in the acoustic wave propagation direction. Specifically, the first and second divided IDT electrode sections 11a and 11b are formed by dividing one of bus bars of the IDT electrode. The other bus bar which is not divided serves as a common bus bar and connects the first and second divided IDT electrode sections 11a and 11b in series. The first divided IDT electrode section 11a is connected to the first balanced terminal 4 through a first signal line 16. The second divided IDT electrode section 11b is connected to the second balanced terminal 5 through a second signal line 17.

Note that a polarity of the IDT electrode 13 is inverted relative to a polarity of the IDT electrode 12 so that a phase of a signal transmitted to the second balanced terminal 5 through the second signal line 17 is shifted by 180 degrees relative to a phase of a signal transmitted to the first balanced terminal 4 through the first signal line 16. As a result, a balanced-unbalanced conversion function is realized.

A first terminal of the second IDT electrode 12 and a first terminal of the third IDT electrode 13 serve as unbalanced ends, and a first terminal of the first divided IDT electrode section 11a of the first IDT electrode 11 and a first terminal of the second divided IDT electrode section 11b of the first IDT electrode 11 serve as first and second balanced ends. In this preferred embodiment of the present invention, the first and second balanced ends preferably are electrode end portions which output signals having phases different from each other. Accordingly, in this preferred embodiment, a terminal portion of the divided bus bar included in the first terminal of the first divided IDT electrode section 11a and a terminal portion of the divided bus bar of the second divided IDT electrode section 11b correspond to the first and second balanced terminals, respectively.

One of the unique characteristics of this preferred embodiment is that an acoustic wave resonator 18 is connected between the first and second signal lines 16 and 17. The acoustic wave resonator 18 includes an IDT electrode 19 and reflectors 20a and 20b which are arranged so that the IDT electrode 19 is sandwiched between the reflectors 20a and 20b in the surface acoustic wave propagation direction. The IDT electrode 19 includes first and second divided bus bars 22a and 22b which are obtained by dividing one of a pair of bus bars which oppose each other in the surface acoustic wave propagation direction whereby first and second divided electrode sections 19a and 19b are formed. The other bus bar which opposes the first and second divided bus bars 22a and 22b serves as a common bus bar 23.

The first divided bus bar 22a is connected to the first signal line 16 at a connection point 25a through a connection line 24a. Furthermore, the second divided bus bar 22b is connected to the second signal line 17 at a connection point 25b through a connection line 24b.

Note that, although not particularly limited to this, the first and second divided bus bars 22a and 22b are disposed nearer to the acoustic wave filter unit 6 relative to the common bus bar 23. Accordingly, the connection line 24a which electrically connects the first divided bus bar 22a to the first signal line 16 and the connection line 24b which connects the second divided bus bar 22b to the second signal line 17 can be made shorter. Consequently, the acoustic wave filter device 1 can be miniaturized.

Note that since phases of signals transmitted from the first and second signal lines 16 and 17 are inverted from each other and the acoustic wave resonator 18 is connected between the first and second signal lines 16 and 17, a precipitous characteristic of a filter characteristic can be improved and a large bandwidth can be attained. Specifically, as with the acoustic wave filter device according to Japanese Unexamined Patent Application Publication No. 2001-308672 described above, a phase of a signal transmitted through the first signal line and a phase of a signal transmitted through the second signal line 17 are inverted from each other. Furthermore, since the acoustic wave resonator 18 is connected between the first and second signal lines 16 and 17, a signal transmitted from the first signal line 16 to the acoustic wave resonator 18 is cancelled by a signal transmitted from the second signal line 17 to the acoustic wave resonator 18. Accordingly, the precipitous characteristic of a filter characteristic is improved.

In addition, since a resonant frequency of the acoustic wave resonator 18 is preferably included in a band lower than a passband of the acoustic wave filter unit 6, and accordingly, an attenuation amount in a band lower than the passband can be increased.

More preferably, the passband of the acoustic wave filter unit 6 includes a resonant frequency to antiresonant frequency of the acoustic wave resonator. In this case, in the passband of the acoustic wave filter unit 6, the acoustic wave resonator 18 has an induction property and does not have a capacitive property. Accordingly, deterioration of an insertion loss due to reactance can be prevented.

Another unique characteristic of the acoustic wave filter device 1 of this preferred embodiment is that a length of a line between the first divided electrode section 19a and the first divided IDT electrode section 11a serving as the first balanced terminal of the acoustic wave filter unit 6 is equal or substantially equal to a length of a line between the second divided electrode section 19b and the second divided IDT electrode section 11b serving as the second balanced terminal of the acoustic wave filter unit 6, and the first divided electrode section 19a and the second divided electrode section 19b are different from each other. That is, since the length of the line between the first divided electrode section 19a and the first balanced terminal and the length of the line between the second divided electrode section 19b and the second balanced terminal are substantially equal to each other, it is determined that an amount of a phase shift of a signal transmitted from the first signal line 16 to the acoustic wave resonator 18 and an amount of a phase shift of a signal transmitted from the second signal line 17 to the acoustic wave resonator 18 are substantially equal to each other. Accordingly, balancing between signals transmitted to the first and second balanced terminals 4 and 5 is efficiently improved.

In addition, since the first and second divided electrode sections 19a and 19b are different from each other, balancing between signals transmitted to the first and second balanced terminals 4 and 5 can be securely improved.

This will be apparent from a concrete example.

The acoustic wave filter device 1 is fabricated by forming electrodes on the piezoelectric substrate in the following configuration.

Electrode finder crossing width in acoustic wave filter unit 6: about 90 μm

The number of electrode fingers in reflectors 14 and 15: 80 each

Electrode finger pitch in reflectors 14 and 15: about 2.136 μm

Metallization ratio in reflectors 14 and 15: about 0.66

The number of pairs of electrode fingers of IDT electrodes 12 and 13: 11.5 pairs each (the number of electrode fingers is 24 each)

Electrode finger pitch of IDT electrodes 12 and 13: about 2.115 μm

Note that, four electrode fingers among the electrode fingers included in the IDT electrode 12, which are located near the IDT electrode 11, and four electrode fingers among the electrode fingers included in the IDT electrode 13, which are located near the IDT electrode 11, have an electrode finger pitch of about 1.998 μm. That is, each of the IDT electrodes 12 and 13 includes a narrow-pitch electrode finger section including the electrode fingers having the electrode finger pitch described above.

Metallization ratio in IDT electrodes 12 and 13: about 0.65 (about 0.63 in narrow-pitch electrode finger sections)

The number of pairs of electrode fingers in IDT electrode 11: 9.5 pairs (the number of electrode fingers is 20)

Electrode finger pitch in IDT electrode 11: about 2.12 μm

Note that narrow-pitch electrode finger sections are disposed on opposite ends of the first IDT electrode 11. Each of the narrow-pitch electrode finger section includes six electrode fingers having an electrode finger pitch of about 1.968 μm.

Metallization ratio of IDT electrode 11: about 0.65 (about 0.63 in narrow-pitch electrode finger sections)

Pitch between IDT electrodes 11 and 12 and pitch between IDT electrodes 12 and 13: distance between the centers of electrode fingers adjacent to each other in IDT electrodes adjacent to each other is about 0.72 μm Pitch between IDT electrode and reflector: distance between the centers of electrode fingers adjacent to each other is about 0.57 μm Electrode finger crossing width in acoustic wave resonator 18: about 80 μm The number of electrode fingers of reflectors 20a and 20b in acoustic wave resonator 18: 30 each Electrode finger pitch of reflectors 20a and 20b and IDT electrode 19: about 2.160 μm Metallization ratio of reflectors 20a and 20b: about 0.50

The number of electrode fingers of first divided electrode section 19a: 28

Then number of electrode fingers of second divided electrode section 19b: 24

Characteristics of the acoustic wave filter device 1 of this preferred embodiment designed as described above were measured. As a comparative example, characteristics of an acoustic wave filter designed similarly to the preferred embodiment described above except for a configuration in which a surface acoustic wave resonator is connected between first and second signal lines, as with the case of Japanese Unexamined Patent Application Publication No. 2001-308672, were measured. Note that, in the comparative example, reflectors included in an acoustic wave resonator are configured the same as those of the foregoing preferred embodiment, the number of electrode fingers included in each of middle IDT electrodes is 52, and an electrode finger pitch and a metallization ratio are the same as those of the acoustic wave resonator of the foregoing preferred embodiment.

Figure 2:
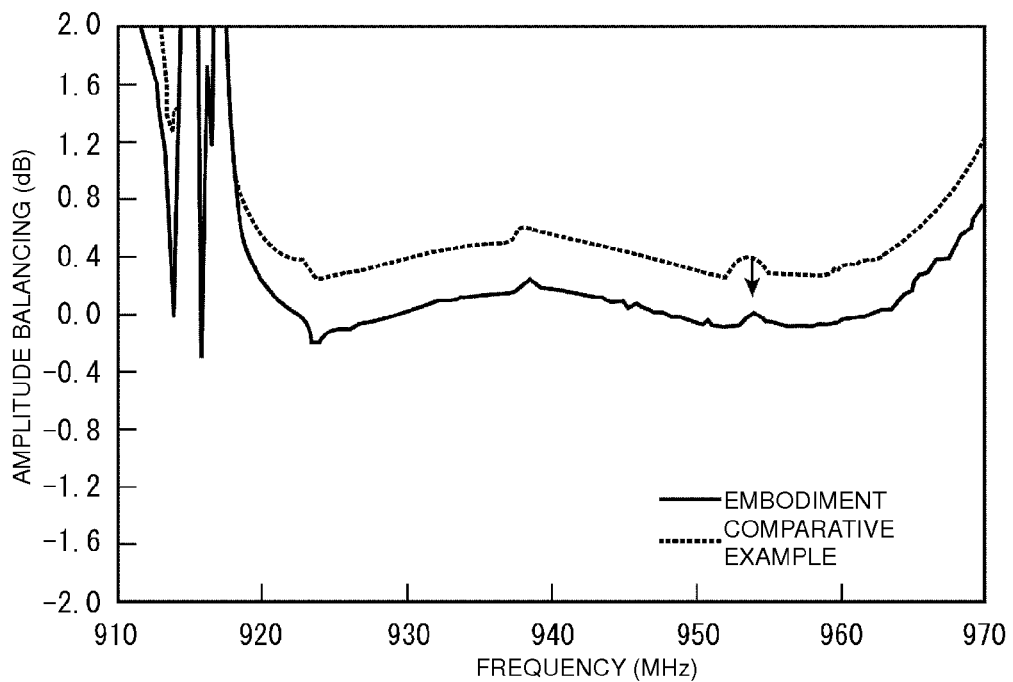
FIG. 2 is a diagram illustrating the relationship between amplitude balancing and a frequency characteristic of the acoustic wave filter device according to the first preferred embodiment and an acoustic wave filter device according to a comparative example.
Figure 3:
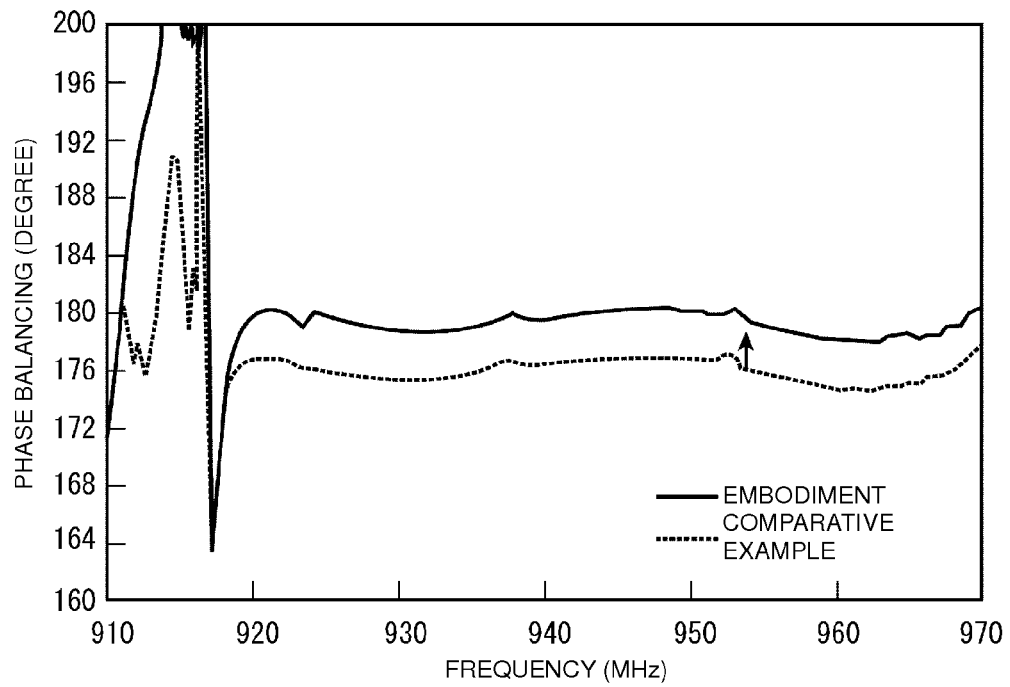
FIG. 3 is a diagram illustrating the relationship between phase balancing and a frequency characteristic of the acoustic wave filter device according to the first preferred embodiment and the acoustic wave filter device according to the comparative example.

FIGS. 2 and 3 show diagrams illustrating an amplitude balancing-to-frequency characteristic and a phase balancing-to-frequency characteristic, respectively, of the acoustic wave filter devices of the foregoing preferred embodiment and the comparative example. In FIGS. 2 and 3, solid lines denote results of the foregoing preferred embodiment whereas dashed lines denote results of the comparative example. In the phase balancing-to-frequency characteristic, according to the foregoing preferred embodiment, a phase balancing is approximately 0 dB in a passband from about 925 MHz to about 960 MHz. Accordingly, it is apparent that the phase balancing is efficiently enhanced when compared with the comparative example.

Furthermore, as is apparent from FIG. 3, similarly, according to the foregoing preferred embodiment, a phase balancing is approximately 180 degrees in the passband from about 925 MHz to about 960 MHz. Accordingly, when compared with the comparative example in which the phase balancing is approximately 176 degrees, the phase balancing is effectively improved.

This improvement is attained for the following reason. Since the length of the line between the first divided electrode section 19a and the first balancing terminal and the length of the line between the second divided electrode section 19b and the second balancing terminal are substantially equal to each other as described above, an amount of a shift of a phase of a signal transmitted from the first signal line 16 to the acoustic wave resonator 18 and an amount of a shift of a phase of a signal transmitted from the second signal line 17 to the acoustic wave resonator 18 are substantially equal to each other, and accordingly, the number of electrode fingers included in the first divided electrode section 19a and the number of electrode fingers included in the second divided electrode section 19b are different from each other.

Figure 4:
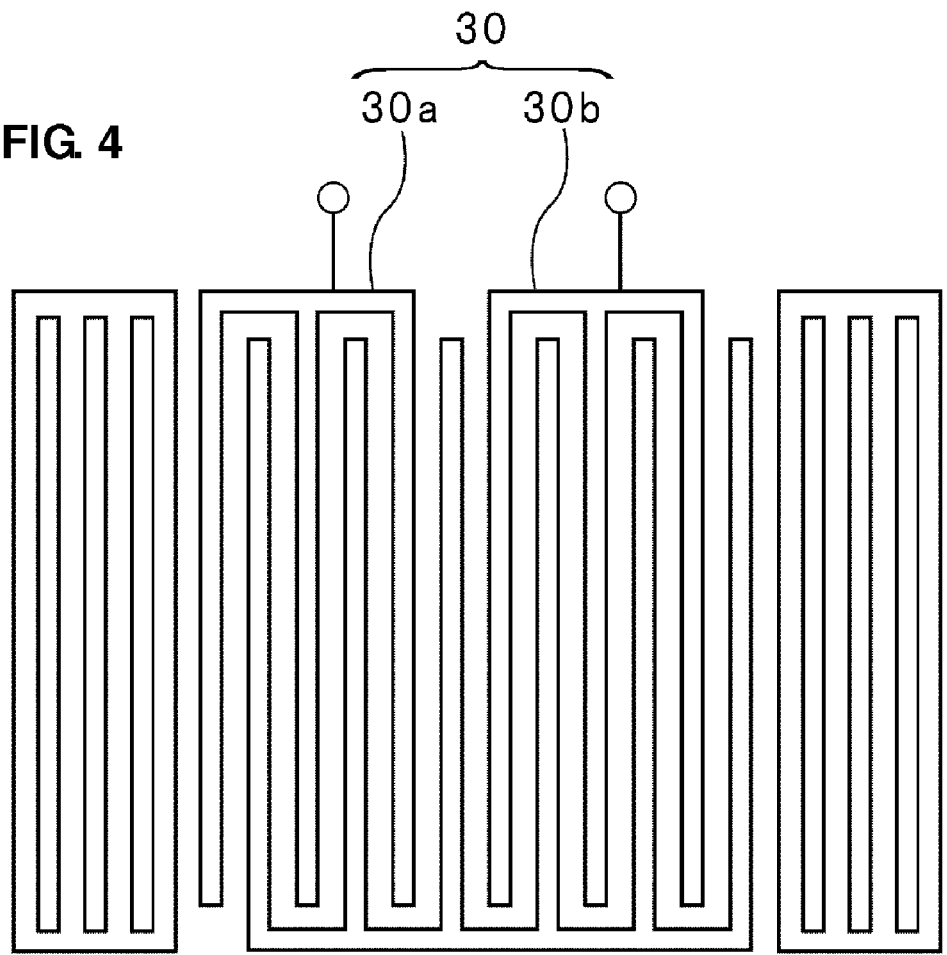
FIG. 4 is a plan view schematically illustrating the relationship between phases of first and second divided electrode sections included in a surface acoustic wave resonator.

Specifically, it is assumed that, as schematically shown in FIG. 4, in an acoustic wave resonator, an IDT electrode 30 includes a first divided electrode section 30a having electrode fingers and a second divided electrode section 30b having electrode fingers, the number of electrode fingers included in the first divided electrode section 30a being not equal to the number of electrode fingers included in the second divided electrode section 30b. In this case, assuming that, as shown in a lower side of FIG. 4, a phase in the first divided electrode section 30a is +90 degrees and a phase in the second divided electrode section 30b is −90 degrees, a phase of 0 degree is obtained at a neutral point which is a middle point between the two. Since the IDT electrode 30 has an asymmetric configuration relative to the neutral point, reactance components to the first and second balancing terminals can be controlled by adjusting the number of electrode fingers included in the first divided electrode sections 30a and the number of electrode fingers included in the second divided electrode sections 30b so that the number of electrode fingers included in the first divided electrode sections 30a and the number of electrode fingers included in the second divided electrode sections 30b are different from each other.

In this preferred embodiment, the number of electrode fingers included in the first divided electrode section 19a and the number of electrode fingers included in the second divided electrode section 19b are different from each other so that deterioration of balancing caused by a difference between strengths of signals output from the first and second balancing terminals is cancelled.

Figure 5:
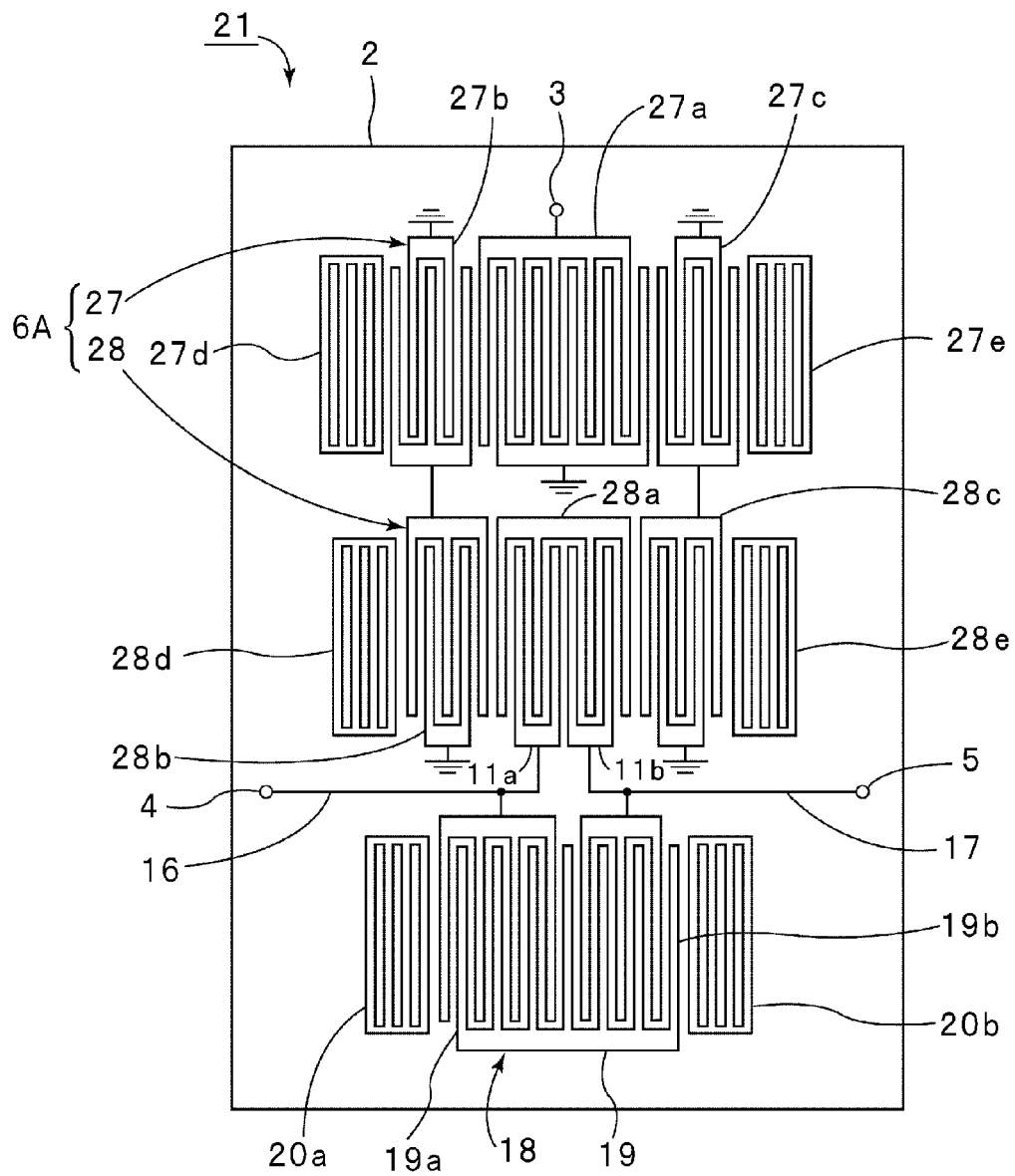
FIG. 5 is a plan view schematically illustrating an acoustic wave filter device according to a second preferred embodiment of the present invention.

FIG. 5 is a plan view schematically illustrating an acoustic wave filter device 21 according to a second preferred embodiment of the present invention. Here, the acoustic wave filter device 21 of the second preferred embodiment is different from the acoustic wave filter device 1 of the first preferred embodiment in that an acoustic wave filter unit 6A having a two-stage cascade-connection configuration is disposed instead of the acoustic wave filter unit 6 included in the acoustic wave filter device 1 of the first preferred embodiment. Therefore, only the longitudinally-coupled resonator type acoustic wave filter unit 6A is described, and the description of the first preferred embodiment is used for description of other components.

The longitudinally-coupled resonator type acoustic wave filter unit 6A includes first and second longitudinally-coupled resonator type acoustic wave filters 27 and 28 which are connected to each other in cascade connection. The acoustic wave filter 27 includes a first IDT electrode 27a and second and third IDT electrodes 27b and 27c which are arranged so that the first IDT electrode 27a is sandwiched between the second and third IDT electrodes 27b and 27c in a surface acoustic wave propagation direction. The acoustic wave filter 28 includes a first IDT electrode 28a and second and third IDT electrodes 28b and 28c which are arranged so that the first IDT electrode 28a is sandwiched between the second and third IDT electrodes 28b and 28c in a surface acoustic wave propagation direction. A region including the IDT electrodes 27a to 27c is sandwiched between reflectors 27d and 27e in the surface acoustic wave propagation direction. Similarly, a region including the IDT electrodes 28a to 28c is sandwiched between reflectors 28d and 28e in the surface acoustic wave propagation direction.

A first terminal of the first IDT electrode 27a is connected to an unbalanced terminal 3 and a second terminal thereof is connected to the ground potential. First terminals of the second and third IDT electrodes 27b and 27c are connected to the ground potential. Second terminals of the second and third IDT electrodes 27b and 27c are connected to first terminals of the second and third IDT electrodes 28b and 28c, respectively. Second terminals of the IDT electrodes 28b and 28c are connected to the ground potential. The IDT electrode 28a is configured similarly to the first IDT electrode 11 included in the acoustic wave filter unit 6 of the first preferred embodiment. That is, the IDT electrode 28a includes first and second divided IDT electrode sections. Accordingly, as with the case of the first preferred embodiment, the description of the first preferred embodiment is incorporated by assigning reference numerals 11a and 11b to the first and second divided IDT electrode units.

Also in the second preferred embodiment, a first signal line 16 is used to connect a first balanced end to a first balanced terminal 4 and a second signal line 17 is used to connect a second balanced end to a second balanced terminal 5, and as with the case of the first preferred embodiment, the first and second signal lines 16 and 17 are connected to an acoustic wave resonator 18. Specifically, a distance between a first divided electrode section 19a of the acoustic wave resonator and the first balanced end and a distance between a second divided electrode section 19b and the second balanced end are substantially equal to each other. Furthermore, the number of electrode fingers of the first divided electrode section 19a and the number of electrode fingers of the second divided electrode section 19b are different from each other. Accordingly, as with the first preferred embodiment, balancing between signals transmitted to the first and second balancing terminals can be efficiently improved.

Figure 6:
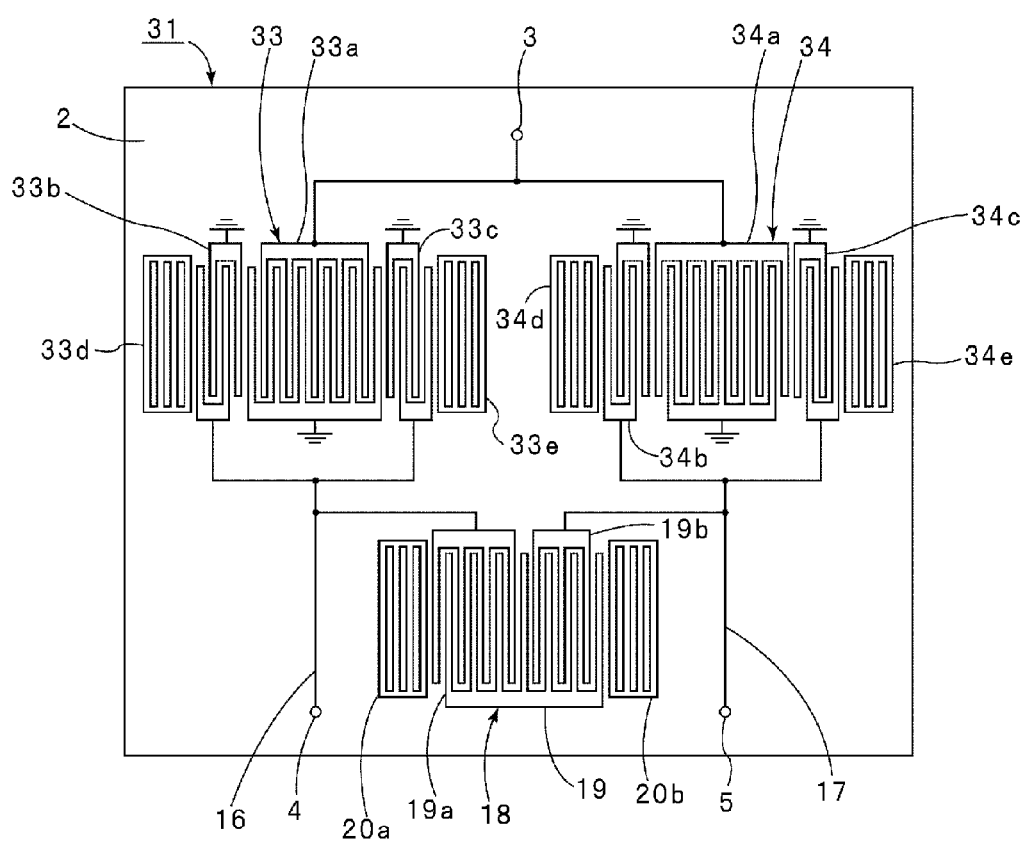
FIG. 6 is a plan view schematically illustrating an acoustic wave filter device according to a third preferred embodiment of the present invention.

FIG. 6 is a plan view schematically illustrating an acoustic wave filter device according to a third preferred embodiment of the present invention. An acoustic wave filter device 31 of the third preferred embodiment is different from the acoustic wave filter devices of the first and second preferred embodiments in that first and second longitudinally-coupled resonator type acoustic wave filter units 33 and 34 which are connected in parallel to an unbalanced terminal 3 are used instead of the acoustic wave filter unit 6 shown in FIG. 1. Therefore, reference numerals the same as those used in the first and second preferred embodiments are used for components the same as those in the first and second preferred embodiments, and accordingly, descriptions thereof are omitted.

Here, a first acoustic wave filter unit 33 includes a first IDT electrode 33a, second and third IDT electrodes 33b and 33c which are arranged so that the first IDT electrode 33a is sandwiched between the second and third IDT electrodes 33b and 33c in a surface acoustic wave propagation direction, and reflectors 33d and 33e which are arranged so that a region including the IDT electrodes 33a to 33c is sandwiched between the reflectors 33d and 33e in a surface wave propagation direction. A second acoustic wave filter unit 34 is similarly configured and includes first to third IDT electrodes 34a to 34c and reflectors 34d and 34e.

A first terminal of the first IDT electrode 33a of the first acoustic wave filter unit 33 is connected to an unbalanced terminal 3, and a second terminal thereof is connected to the ground potential. First terminals of the second and third IDT electrodes 33b and 33c are connected to the ground potential, and second terminals of the second and third IDT electrodes 33b and 33c are connected to each other and further connected to a first balanced terminal 4.

A first terminal of the first IDT electrode 34a of the second acoustic wave filter unit 34 is connected to the unbalanced terminal 3, and a second terminal thereof is connected to the ground potential. First terminals of the second and third IDT electrodes 34b and 34c are connected to the ground potential, and second terminals of the second and third IDT electrodes 34b and 34c are connected to each other and further connected to a second balanced terminal 5.

Here, the first terminals of the first and second IDT electrodes 33a and 34a serve as unbalanced ends, the second terminals of the IDT electrodes 34b and 34c serve as first balanced ends, and the second terminals of the IDT electrodes 34b and 34c serve as second balanced ends.

A phase of a signal transmitted through a first signal line 16 which connects the first balanced ends to the first balanced terminal 4 is shifted by 180 degrees relative to a phase of a signal transmitted through a second signal line 17 which connects the second balanced ends to the second balanced terminal 5. Then, also in this preferred embodiment, similarly to the first preferred embodiment, since an acoustic wave resonator 18 is connected between the first and second signal lines, balancing between signals transmitted to the first and second balanced terminals 4 and 5 can be efficiently improved similarly to the first preferred embodiment.

Figure 7:
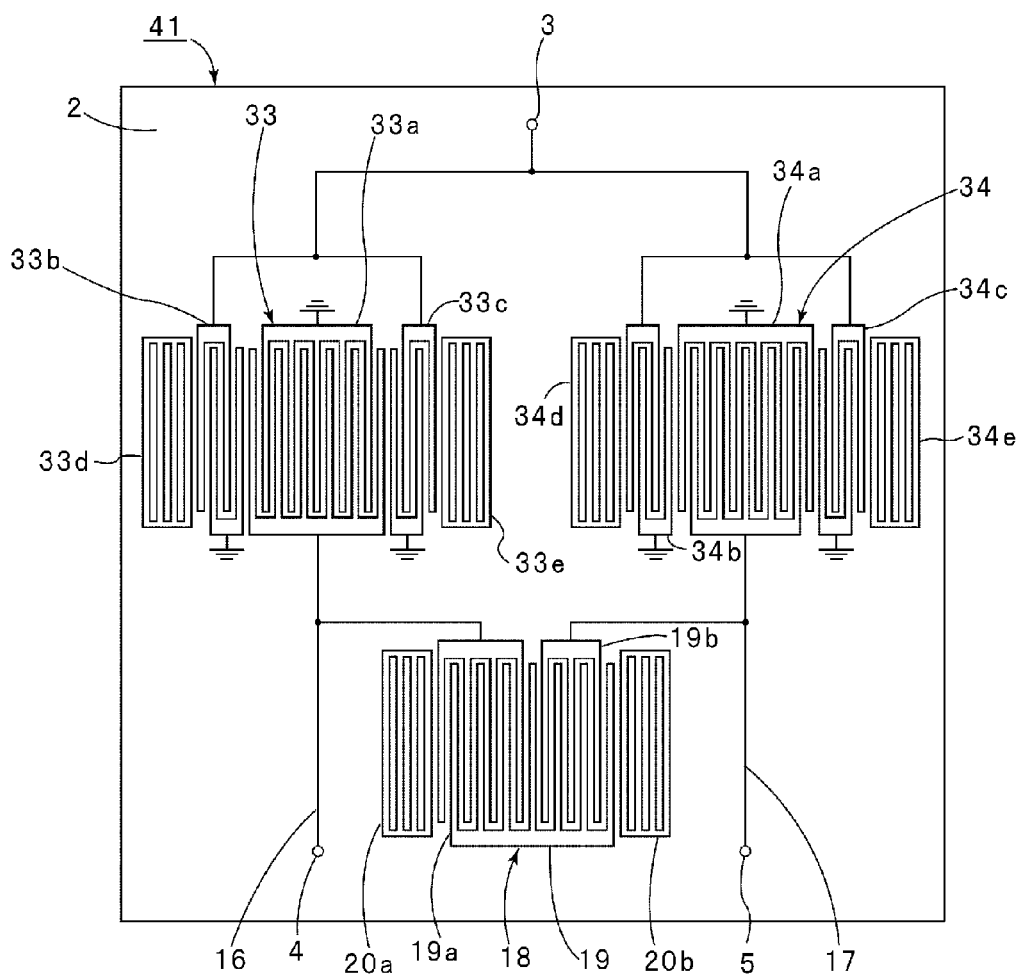
FIG. 7 is a plan view schematically illustrating an acoustic wave filter device according to a fourth preferred embodiment of the present invention.

FIG. 7 is a plan view schematically illustrating an acoustic wave filter device according to a fourth preferred embodiment of the present invention. An acoustic wave filter device 41 of the fourth preferred embodiment is a modification example of the acoustic wave filter device 31 of the third preferred embodiment. The acoustic wave filter device 41 is different from the acoustic wave filter device 31 in that first terminals of second and third IDT electrodes 33b and 33c which are arranged so that a first IDT electrode 33a which is located in the middle of an acoustic wave filter unit 33 is sandwiched between the second and third IDT electrodes 33b and 33c are connected to each other and further connected to an unbalanced terminal 3 and second terminals thereof are connected to the ground potential, and similarly, first terminals of second and third IDT electrodes 34b and 34c are connected to each other and further connected to the unbalanced terminal 3 and second terminals thereof are connected to the ground potential, and in addition, a first terminal of the first middle IDT electrode 33a and a first terminal of a first middle IDT electrode 34a are connected to first and second balanced terminals 4 and 5, respectively. Other configurations are the same as those of the third preferred embodiment. Accordingly, also in the acoustic wave filter device 41 of the fourth preferred embodiment, balancing between signals transmitted to the first and second balanced terminals 4 and 5 can be effectively improved.

Figure 8:
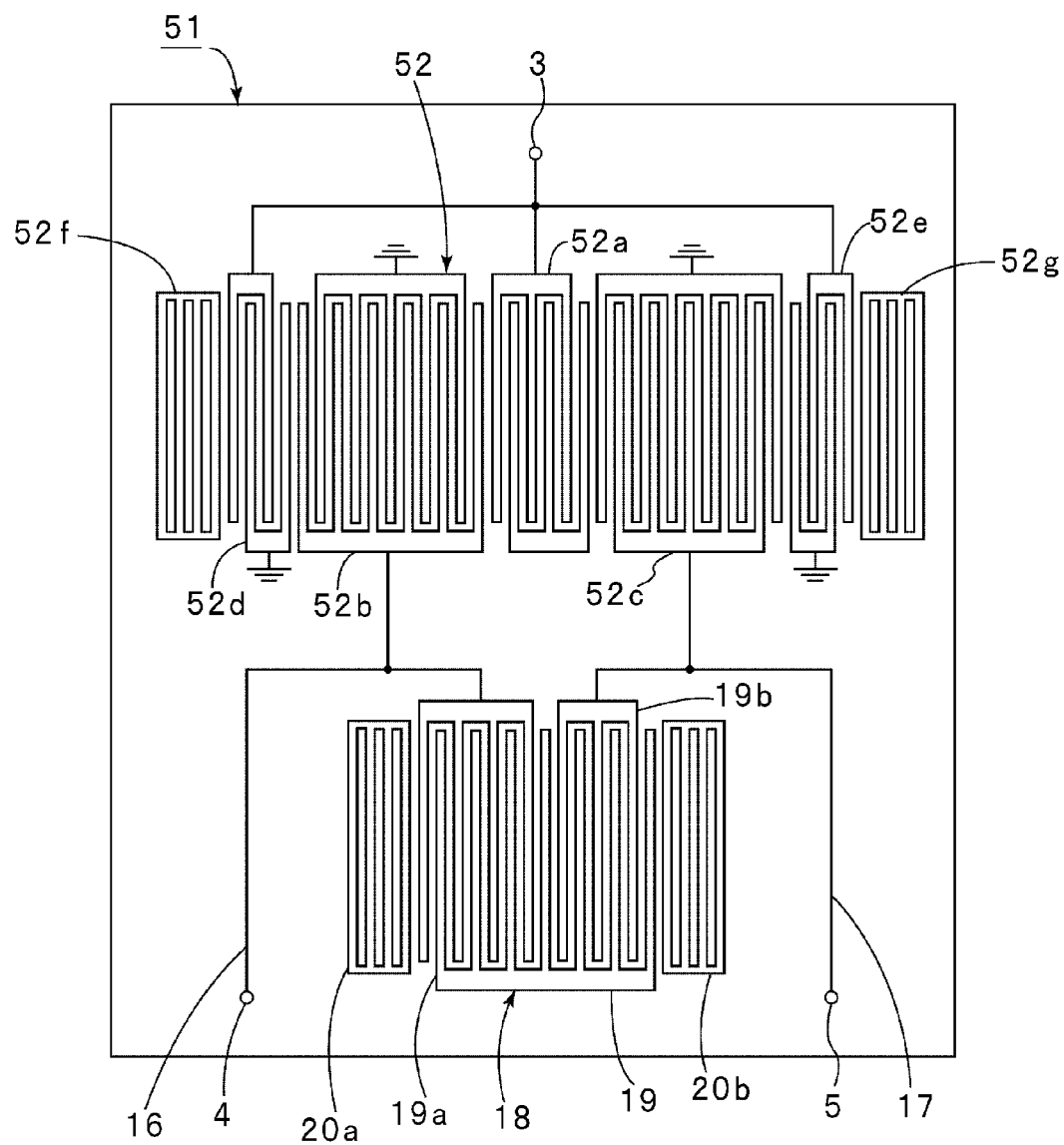
FIG. 8 is a plan view schematically illustrating an acoustic wave filter device according to a fifth preferred embodiment of the present invention.

FIG. 8 is a plan view schematically illustrating an acoustic wave filter device according to a fifth preferred embodiment. An acoustic wave filter device 51 of the fifth preferred embodiment is different from that of the first preferred embodiment in that a 5-IDT electrode longitudinally-coupled resonator type surface acoustic wave filter unit 52 is provided instead of the acoustic wave filter unit 6 included in the acoustic wave filter device 1 of the first preferred embodiment.

The acoustic wave filter unit 52 includes a first IDT electrode 52a located in the middle, second and third IDT electrodes 52b and 52c which are located so that the first IDT electrode 52a is sandwiched between the second and third IDT electrodes 52b and 52c in an acoustic wave propagation direction, and fourth and fifth IDT electrodes 52d and 52e which are located so that a region including the first to third IDT electrodes 52a to 52c is sandwiched between the fourth and fifth IDT electrodes 52d and 52e in the surface wave propagation direction. Reflectors 52f and 52g are arranged so that a region including the IDT electrodes 52a to 52e is sandwiched between the reflectors 52f and 52g. Here, first terminals of the first, fourth, and fifth IDT electrodes 52a serve as unbalanced ends, and the first terminals are connected to each other, and further connected to an unbalanced terminal 3. Second terminals of the IDT electrodes 52a, 52d, and 52e are connected to the ground potential.

The second IDT electrode 52b has a polarity which is inverted relative to a polarity of the third IDT electrode 52c. Then, the first terminal of the second IDT electrode 52d is connected to the ground, and the second terminal is connected to the first balanced terminal 4. Similarly, a first terminal of the third IDT electrode 52c is connected to the ground and a second terminal thereof is connected to the second balanced terminal 5. Note that the second terminal of the IDT electrode 52b corresponds to a first balanced end, and the second terminal of the IDT electrode 52c corresponds to a second balanced end.

As with the first preferred embodiment, also in the fifth preferred embodiment, since an acoustic wave resonator 18 is connected between first and second signal lines, balancing between signals transmitted to the first and second balanced terminals 4 and 5 can be effectively improved.

Figure 9:
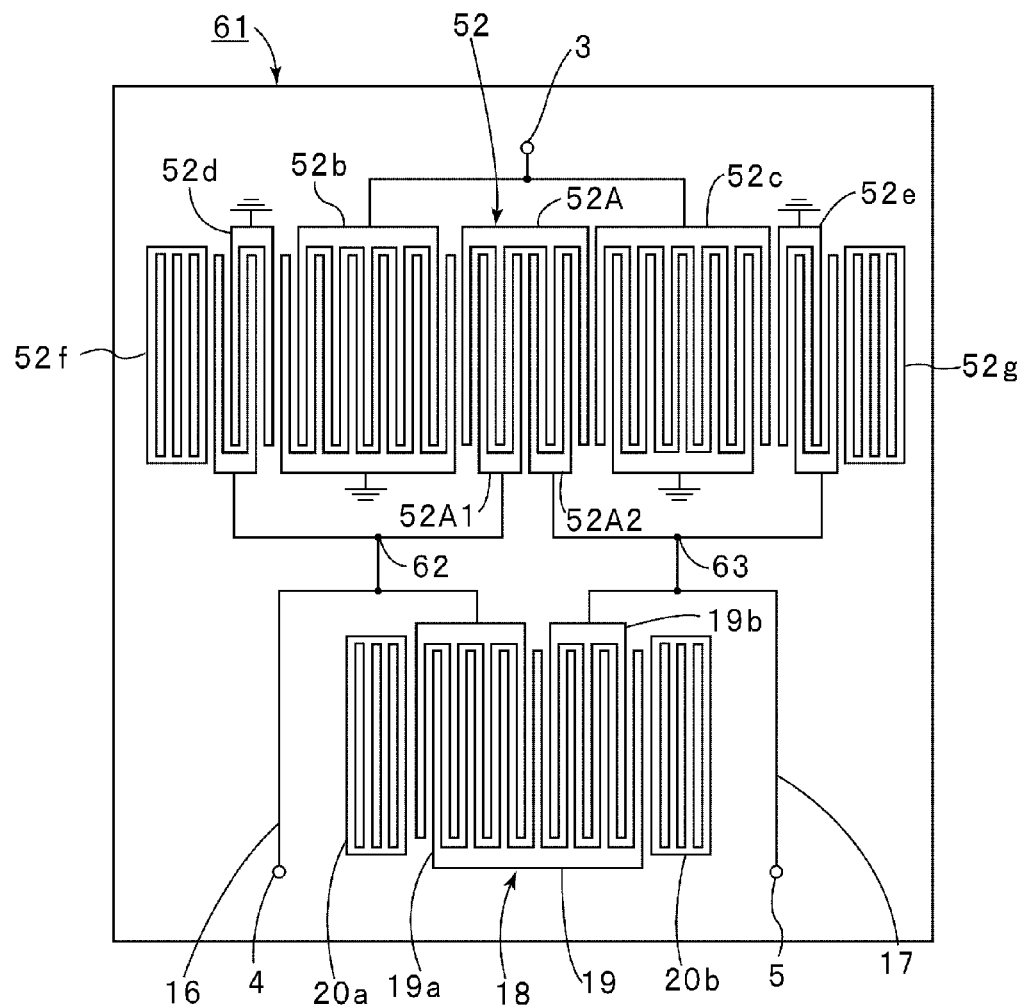
FIG. 9 is a plan view schematically illustrating an acoustic wave filter device according to a sixth preferred embodiment of the present invention.

FIG. 9 is a plan view schematically illustrating an acoustic wave filter device according to a sixth preferred embodiment according to the present invention. An acoustic wave filter device 61 is a modification example of the acoustic wave filter device 51 of the fifth preferred embodiment. The acoustic wave filter device 61 is different from the acoustic wave filter device 51 in that, in a 5-IDT electrode longitudinally-coupled resonator type surface acoustic wave filter unit 52, first terminals of second and third IDT electrodes 52b and 52c serve as unbalanced ends, the first terminals are connected to each other and further connected to an unbalanced terminal 3, first, fourth, and fifth IDT electrodes 52A, 52d, and 52e are connected to one another on a balanced terminal side.

Note that the first IDT electrode 52A arranged in the middle includes first and second divided IDT electrodes 52A1 and 52A2 which are obtained by dividing the IDT electrode 52A in a surface wave propagation direction.

A first terminal of the fourth IDT electrode 52d and a first terminal of the first divided IDT electrode section 52A1 are connected to a first balanced terminal 4. Note that the first terminals of the fourth IDT electrode 52d and the first divided IDT electrode section 52A1 correspond to first balanced ends, and are connected to each other at a connection point 62. A second terminal of the IDT electrode 52d is connected to the ground potential.

Furthermore, a first terminal of the second divided IDT electrode section 52A2 and a first terminal of the fifth IDT electrode 52e correspond to second balancing ends, and are connected to each other at a connection point 63. The connection point 63 is connected to a second balanced terminal 5 through a second signal line 17. A second terminal of the fifth IDT electrode 52e is connected to the ground potential.

Also in the sixth preferred embodiment, as with the first preferred embodiment, since an acoustic wave resonator 18 is connected between first and second signal lines, balancing between signals transmitted to the first and second balanced terminals 4 and 5 can be efficiently improved.

Figure 10:
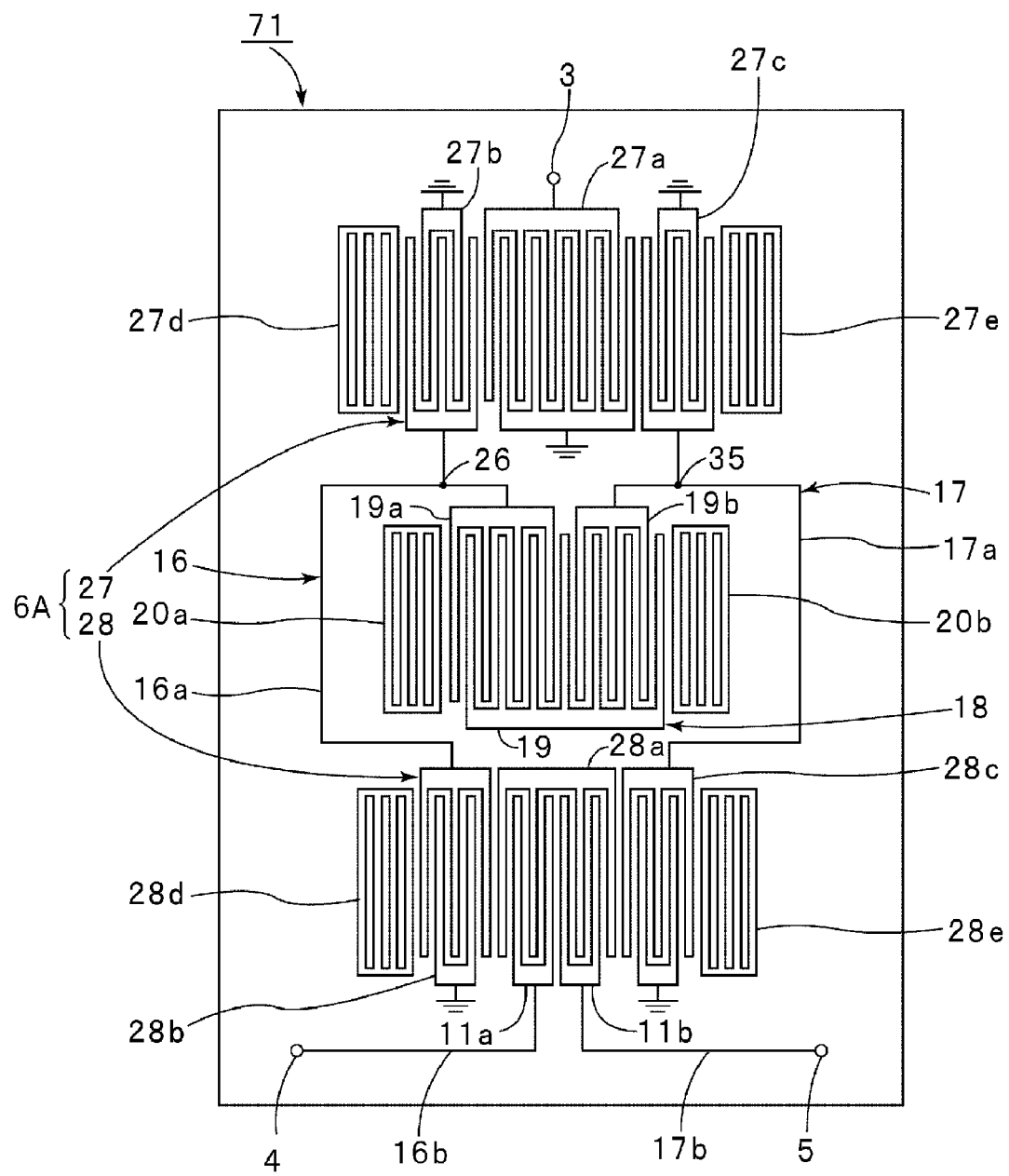
FIG. 10 is a plan view schematically illustrating an acoustic wave filter device according to a seventh preferred embodiment of the present invention.

FIG. 10 is a plan view schematically illustrating an acoustic wave filter device according to a seventh preferred embodiment of the present invention. As with the case of the acoustic wave filter device 21 of the second preferred embodiment shown in FIG. 5, an acoustic wave filter device 71 includes first and second longitudinally-coupled resonator type acoustic wave filters 27 and 28 which are connected to each other in two-stage cascade connection. Therefore, components the same as those of the second preferred embodiment are denoted by reference numerals the same as those of the second preferred embodiment, and descriptions thereof are omitted. Note that, in FIG. 5, the acoustic wave resonator 18 is connected to an output side of the acoustic wave filter 28, and physically, the acoustic wave resonator 18 is disposed on an opposite side of the first acoustic wave filter 27 relative to the second acoustic wave filter 28.

However, in the acoustic wave filter device 71 of the second preferred embodiment, an acoustic wave resonator 18 is disposed between two stages constituted by first and second acoustic wave filters 27 and 28, and is connected to first and second signal lines. Furthermore, also in physical layout, the acoustic wave resonator 18 is disposed in a region between the first and second acoustic wave filters 27 and 28. In this way, when an acoustic wave filter unit having a plurality of stages is used, a surface acoustic wave resonator may be disposed between the stages.

Here, only components different from those of the second preferred embodiment are described, and components the same as those of the second preferred embodiment are omitted by incorporating the description of the acoustic wave filter device 21 shown in FIG. 5.

First terminals of second and third IDT electrodes 27b and 27c of a first acoustic wave filter 27 are connected to the ground potential, and second terminals thereof are connected to first terminals of second and third IDT electrode 28b and 28c of an acoustic wave filter 28, respectively, and in addition, electrically connected to first and second divided electrode sections 19a and 19b, respectively.

More specifically, the second terminal of the IDT electrode 27b is connected to the IDT electrode 28b through a first signal line. Note that a first balanced end corresponds to an end portion of a bus bar disposed on an opposite side of the terminal of the IDT electrode 27b connected to the ground potential, and a second balanced end corresponds to an end of a bus bar disposed on an opposite side of the terminal of the IDT electrode 27c connected to the ground potential. This is because, as with the case of the second preferred embodiment, phases of signals output from the ID electrodes 27b and 27c are different from each other by 180 degrees. That is, the first and second balanced ends correspond to output terminal portions in which a phase of one transmission signal is shifted by 180 degrees relative to a phase of the other transmission signal in a longitudinally-coupled resonator type acoustic wave filter unit.

Accordingly, in FIG. 10, the first signal line corresponds to a portion which connects the first balanced end to the first balanced terminal 4. More specifically, the first signal line includes a line portion 16a which connects the terminal of the IDT electrode 27b to the IDT electrode 28b and a line portion 16b which connects a first divided IDT electrode section 11a to the first balanced terminal 4. Similarly, a second signal line 17 includes not only a line portion 17a which connects the terminal of the IDT electrode 27c to the IDT electrode 28c but also a line portion 17b which connects a second divided IDT electrode section 11b to a second balanced terminal 5. Then, the acoustic wave resonator 18 is connected between the first and second signal lines 16 and 17 similarly to the second preferred embodiment. More specifically, the first divided electrode section 19a of the acoustic wave resonator 18 is connected to a connection point 26, and the second divided electrode section 19b is connected to a second connection point 35.

Also in this preferred embodiment, as with the first preferred embodiment, since a surface acoustic wave resonator is connected, that is, since a distance between the first balanced end and the connection point 26 is substantially equal to a distance between the balanced end and the second connection point 35, and furthermore, the number of electrode fingers of the first divided electrode section 19a is different from the number of electrode fingers of the second divided electrode section 19b, balancing between signals transmitted to the first and second balanced terminals 4 and 5 can be efficiently improved.

Figure 11:
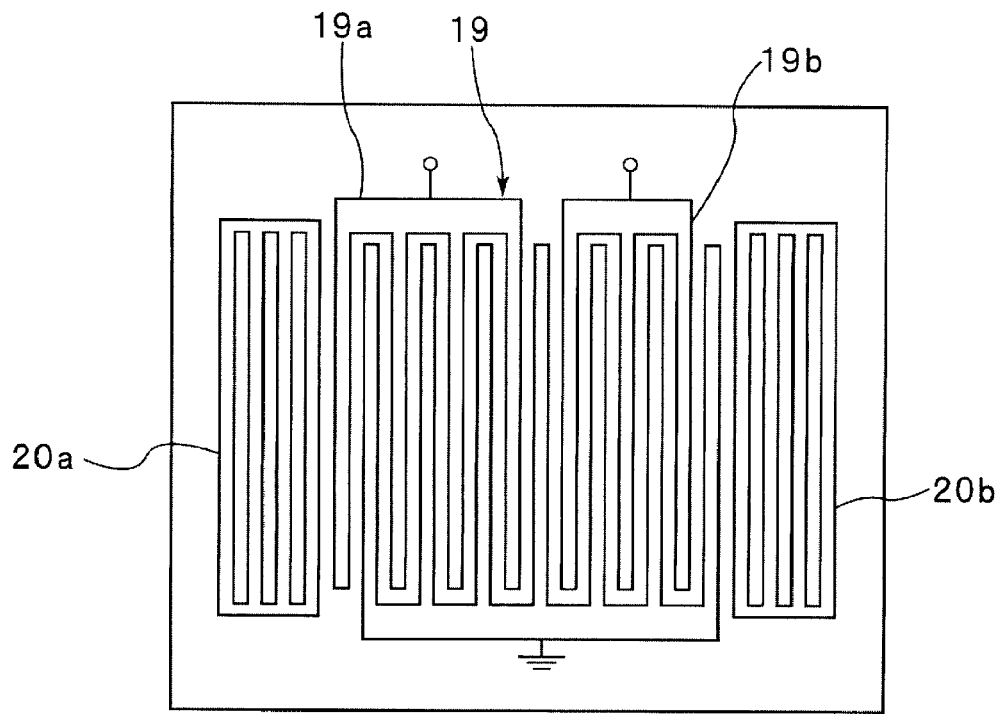
FIG. 11 is a plan view schematically illustrating a modification example of a surface acoustic wave resonator according to a preferred embodiment of the present invention.

Note that in the IDT electrode 19 of the preferred embodiment shown in FIG. 1, the common bus bar is floated. However, the common bus bar of the IDT electrode 19 may be connected to the ground potential so that the center point is connected to the ground potential as shown in FIG. 11.

Figure 12:
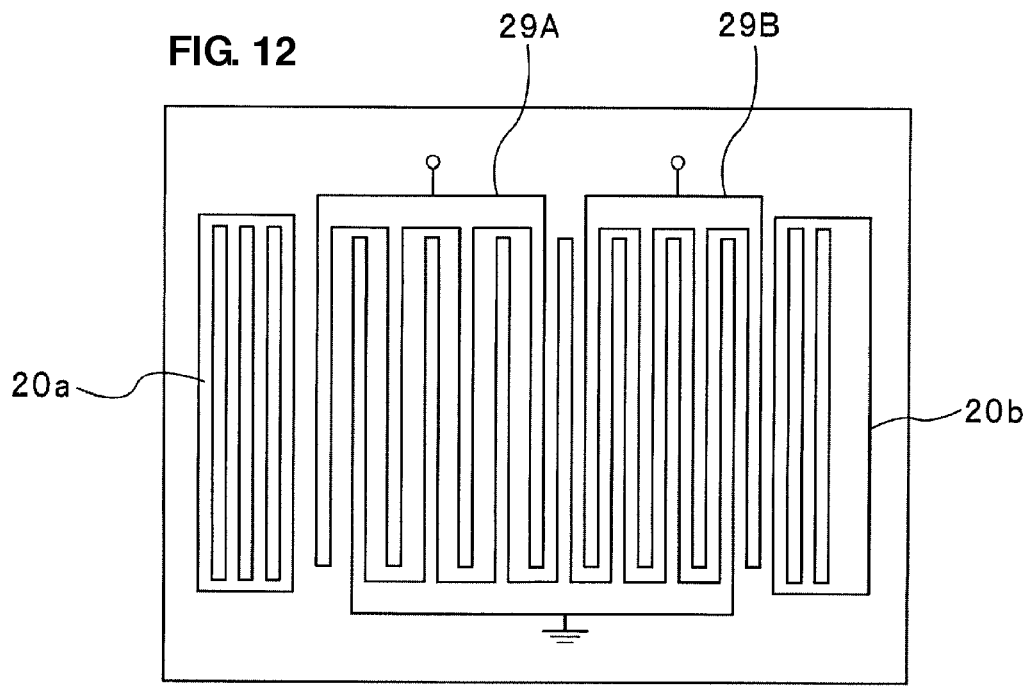
FIG. 12 is a plan view schematically illustrating another modification example of a surface acoustic wave resonator according to a preferred embodiment of the present invention.
Figure 13:
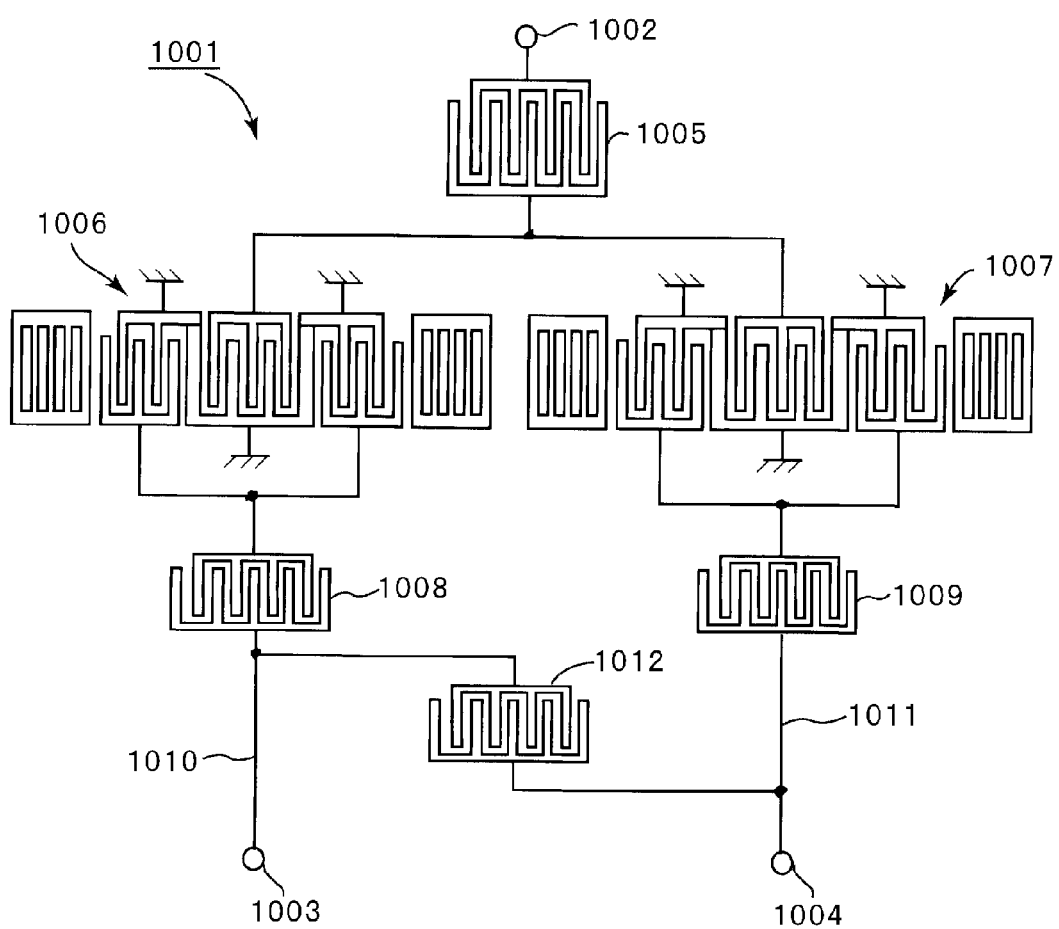
FIG. 13 is a plan view schematically illustrating a known surface acoustic wave filter device.

Furthermore, in the foregoing preferred embodiments and the modification examples, the number of electrode fingers of the first divided electrode section 19a is different from the number of electrode fingers of the second divided electrode section 19b. However, the first and second divided electrode sections may be configured so as to be different from each other by changing an item other than the number of electrode fingers. For example, as shown in FIG. 12, an electrode finger pitch of a first divided electrode section 29A may be different from an electrode finger pitch of a second divided electrode section 29B. Alternatively, a metallization ratio of the first divided electrode section may be different from that of the second divided electrode section.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A longitudinally-coupled resonator type acoustic wave filter device comprising:
    an unbalanced terminal;
    first and second balanced terminals arranged to provide a balanced-unbalanced conversion function;
    a piezoelectric substrate;
    a longitudinally-coupled resonator type acoustic wave filter unit which is disposed on the piezoelectric substrate and which includes an unbalanced end connected to the unbalanced terminal and first and second balanced ends arranged to output respective signals having phases different from each other by 180 degrees;
    an acoustic wave resonator which is disposed on the piezoelectric substrate and which includes an IDT electrode including first and second bus bars which oppose each other and a pair of reflectors arranged so that the IDT electrode is sandwiched between the reflectors in an acoustic wave propagation direction; and
    first and second signal lines including first ends connected to the first and second balanced ends of the acoustic wave filter unit, respectively, and second terminals connected to the first and second balanced terminals, respectively; wherein
    the acoustic wave resonator includes first and second divided electrode sections obtained by dividing the first bus bar of the IDT electrode of the acoustic wave resonator into two, and the first and second divided electrode sections are connected to each other in series in the acoustic wave propagation direction by the second bus bar;

one terminal of the first divided electrode section which is arranged opposite to the second bus bar is connected to the first signal line;

one terminal of the second divided electrode section which is arranged opposite to the second bus bar is connected to the second signal line;

a length of a line which connects the first divided electrode section to the first balanced end is equal or substantially equal to a length of a line which connects the second divided electrode section to the second balanced end, and the first divided electrode section is different from the second divided electrode section; and a number of electrode fingers included in the first divided electrode section is different from a number of electrode fingers included in the second divided electrode section.

2. The acoustic wave filter device according to claim 1, wherein the longitudinally-coupled resonator type acoustic wave filter unit includes three or more odd number of IDT electrodes which are arranged on the piezoelectric substrate in the acoustic wave propagation direction, among the odd number of IDT electrodes, an IDT electrode arranged in the middle in the acoustic wave propagation direction includes first and second divided IDT sections which are obtained by dividing the IDT electrode into two in the acoustic wave propagation direction, the first and second divided IDT sections include the first and second balanced ends, respectively, and two IDT electrodes arranged so that the IDT electrode in the middle is sandwiched between them.

3. The acoustic wave filter device according to claim 1, wherein the longitudinally-coupled resonator type acoustic wave filter unit includes three or more odd number of IDT electrodes arranged on the piezoelectric substrate in the acoustic wave propagation direction, among the odd number of IDT electrodes, an IDT electrode arranged in the middle in the acoustic wave propagation direction is connected to the unbalanced terminal, and IDT electrodes arranged so that the IDT electrode arranged in the middle is sandwiched between them.

4. The acoustic wave filter device according to claim 1, wherein the longitudinally-coupled acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction, one terminal of an IDT electrode arranged in the middle among the odd number of IDT electrodes included in the first acoustic wave filter unit corresponds to the unbalanced end or the first balanced end, and one end of an IDT electrode and one end of another IDT electrode, the IDT electrodes being arranged so that the IDT electrode arranged in the middle is sandwiched between the IDT electrodes, correspond to the first balanced end or the unbalanced end, and one terminal of an IDT electrode arranged in the middle in the acoustic wave propagation direction among the odd number of IDT electrodes included in the second acoustic wave filter unit corresponds to the unbalanced end or the second balanced end, and one end of an IDT electrode and one end of another IDT electrode, the IDT electrodes being arranged so that the IDT electrode arranged in the middle is sandwiched between the IDT electrodes, correspond to the second balanced end or the unbalanced end.

5. The acoustic wave filter device according to claim 1, wherein the longitudinally-coupled resonator type acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction, the first and second acoustic wave filter units are arranged so as to be perpendicular or substantially perpendicular to the acoustic wave propagation direction of the acoustic wave filter units and are connected to each other in a two-stage cascade connection, when both sides of each of IDT electrodes arranged in the middle of the first and second acoustic wave filter units are determined to be a first side and a second side, one terminal of an IDT adjacent to the first side of the IDT electrode in the middle of the first acoustic wave filter unit is connected through the first signal line to one terminal of an IDT adjacent to the first side of the second acoustic wave filter unit in the acoustic wave propagation direction, one end of an IDT adjacent to the second side of the IDT electrode arranged in the middle of the first acoustic wave filter unit is connected through the second signal line to one terminal of an IDT electrode adjacent to the second side of the IDT electrode arranged in the middle of the second acoustic wave filter unit, a phase of an electric signal transmitted through the first signal line is different from a phase of an electric signal transmitted through the second signal line, and one terminal of the IDT electrode arranged in the middle of the first acoustic wave filter unit corresponds to the unbalanced end, one terminal of an IDT and one terminal of another IDT, the IDTs being arranged so that the IDT electrode in the middle is sandwiched between the IDTs in the acoustic wave propagation direction, correspond to the first and second balanced ends, and the first and second balanced ends and the first and second balanced terminals are connected to each other through the second acoustic wave filter unit using the first and second signal lines, respectively.

6. The acoustic wave filter device according to claim 5, wherein the acoustic wave resonator is connected to the first and second signal lines in a stage subsequent to the second acoustic wave filter unit.

7. The acoustic wave filter device according to claim 5, wherein the acoustic wave resonator is connected to the first and second signal lines in a stage followed by a stage of the second acoustic wave filter unit and between the first and second acoustic wave filter units.

8. The acoustic wave filter device according to claim 1, wherein, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode is determined to be an electrode finger connected to a hot potential, and the number of electrode fingers included in the first divided electrode section is larger than the number of electrode fingers included in the second divided electrode section.

9. The acoustic wave filter device according to claim 1, wherein, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode is determined to be an electrode finger connected to a ground potential, and the number of electrode fingers included in the first divided electrode section is smaller than the number of electrode fingers included in the second divided electrode section.

10. The acoustic wave filter device according to claim 1, wherein the second bus bar of the acoustic wave resonator is connected to the ground potential.

11. The acoustic wave filter device according to claim 1, wherein a band between a resonant frequency and an anti-resonant frequency of the acoustic wave resonator includes a passband of the longitudinally-coupled resonator type acoustic wave filter unit.

12. A longitudinally-coupled resonator type acoustic wave filter device comprising:
an unbalanced terminal;
first and second balanced terminals arranged to provide a balanced-unbalanced conversion function;
a piezoelectric substrate;
a longitudinally-coupled resonator type acoustic wave filter unit which is disposed on the piezoelectric substrate and which includes an unbalanced end connected to the unbalanced terminal and first and second balanced ends arranged to output respective signals having phases different from each other by 180 degrees;
an acoustic wave resonator which is disposed on the piezoelectric substrate and which includes an IDT electrode including first and second bus bars which oppose each other and a pair of reflectors arranged so that the IDT electrode is sandwiched between the reflectors in an acoustic wave propagation direction; and
first and second signal lines including first ends connected to the first and second balanced ends of the acoustic wave filter unit, respectively, and second terminals connected to the first and second balanced terminals, respectively; wherein
the acoustic wave resonator includes first and second divided electrode sections obtained by dividing the first bus bar of the IDT electrode of the acoustic wave resonator into two, and the first and second divided electrode sections are connected to each other in series in the acoustic wave propagation direction by the second bus bar;
one terminal of the first divided electrode section which is arranged opposite to the second bus bar is connected to the first signal line;
one terminal of the second divided electrode section which is arranged opposite to the second bus bar is connected to the second signal line;
a length of a line which connects the first divided electrode section to the first balanced end is equal or substantially equal to a length of a line which connects the second divided electrode section to the second balanced end, and the first divided electrode section is different from the second divided electrode section; and
a metallization ratio of the first divided electrode section is different from a metallization ratio of the second divided electrode section.

13. The acoustic wave filter device according to claim 12, wherein, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode is determined to be an electrode finger connected to a hot potential, and the number of electrode fingers included in the first divided electrode section is larger than the number of electrode fingers included in the second divided electrode section.

14. The acoustic wave filter device according to claim 12, wherein, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode is determined to be an electrode finger connected to a ground potential, and the number of electrode fingers included in the first divided electrode section is smaller than the number of electrode fingers included in the second divided electrode section.

15. The acoustic wave filter device according to claim 12, wherein the second bus bar of the acoustic wave resonator is connected to the ground potential.

16. The acoustic wave filter device according to claim 12, wherein a band between a resonant frequency and an anti-resonant frequency of the acoustic wave resonator includes a passband of the longitudinally-coupled resonator type acoustic wave filter unit.

17. The acoustic wave filter device according to claim 12, wherein the longitudinally-coupled resonator type acoustic wave filter unit includes three or more odd number of IDT electrodes which are arranged on the piezoelectric substrate in the acoustic wave propagation direction, among the odd number of IDT electrodes, an IDT electrode arranged in the middle in the acoustic wave propagation direction includes first and second divided IDT sections which are obtained by dividing the IDT electrode into two in the acoustic wave propagation direction, the first and second divided IDT sections include the first and second balanced ends, respectively, and two IDT electrodes arranged so that the IDT electrode in the middle is sandwiched between them.

18. The acoustic wave filter device according to claim 12, wherein the longitudinally-coupled resonator type acoustic wave filter unit includes three or more odd number of IDT electrodes arranged on the piezoelectric substrate in the acoustic wave propagation direction, among the odd number of IDT electrodes, an IDT electrode arranged in the middle in the acoustic wave propagation direction is connected to the unbalanced terminal, and IDT electrodes arranged so that the IDT electrode arranged in the middle is sandwiched between them.

19. The acoustic wave filter device according to claim 12, wherein the longitudinally-coupled acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction, one terminal of an IDT electrode arranged in the middle among the odd number of IDT electrodes included in the first acoustic wave filter unit corresponds to the unbalanced end or the first balanced end, and one end of an IDT electrode and one end of another IDT electrode, the IDT electrodes being arranged so that the IDT electrode arranged in the middle is sandwiched between the IDT electrodes, correspond to the first balanced end or the unbalanced end, and one terminal of an IDT electrode arranged in the middle in the acoustic wave propagation direction among the odd number of IDT electrodes included in the second acoustic wave filter unit corresponds to the unbalanced end or the second balanced end, and one end of an IDT electrode and one end of another IDT electrode, the IDT electrodes being arranged so that the IDT electrode arranged in the middle is sandwiched between the IDT electrodes, correspond to the second balanced end or the unbalanced end.

20. The acoustic wave filter device according to claim 12, wherein the longitudinally-coupled resonator type acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction, the first and second acoustic wave filter units are arranged so as to be perpendicular or substantially perpendicular to the acoustic wave propagation direction of the acoustic wave filter units and are connected to each other in a two-stage cascade connection, when both sides of each of IDT electrodes arranged in the middle of the first and second acoustic wave filter units are determined to be a first side and a second side, one terminal of an IDT adjacent to the first side of the IDT electrode in the middle of the first acoustic wave filter unit is connected through the first signal line to one terminal of an IDT adjacent to the first side of the second acoustic wave filter unit in the acoustic wave propagation direction, one end of an IDT adjacent to the second side of the IDT electrode arranged in the middle of the first acoustic wave filter unit is connected through the second signal line to one terminal of an IDT electrode adjacent to the second side of the IDT electrode arranged in the middle of the second acoustic wave filter unit, a phase of an electric signal transmitted through the first signal line is different from a phase of an electric signal transmitted through the second signal line, and one terminal of the IDT electrode arranged in the middle of the first acoustic wave filter unit corresponds to the unbalanced end, one terminal of an IDT and one terminal of another IDT, the IDTs being arranged so that the IDT electrode in the middle is sandwiched between the IDTs in the acoustic wave propagation direction, correspond to the first and second balanced ends, and the first and second balanced ends and the first and second balanced terminals are connected to each other through the second acoustic wave filter unit using the first and second signal lines, respectively.

21. The acoustic wave filter device according to claim 20, wherein the acoustic wave resonator is connected to the first and second signal lines in a stage subsequent to the second acoustic wave filter unit.

22. The acoustic wave filter device according to claim 20, wherein the acoustic wave resonator is connected to the first and second signal lines in a stage followed by a stage of the second acoustic wave filter unit and between the first and second acoustic wave filter units.

23. A longitudinally-coupled resonator type acoustic wave filter device comprising:

an unbalanced terminal;

first and second balanced terminals arranged to provide a balanced-unbalanced conversion function;

a piezoelectric substrate;

a longitudinally-coupled resonator type acoustic wave filter unit which is disposed on the piezoelectric substrate and which includes an unbalanced end connected to the unbalanced terminal and first and second balanced ends arranged to output respective signals having phases different from each other by 180 degrees;

an acoustic wave resonator which is disposed on the piezoelectric substrate and which includes an IDT electrode including first and second bus bars which oppose each other and a pair of reflectors arranged so that the IDT electrode is sandwiched between the reflectors in an acoustic wave propagation direction; and first and second signal lines including first ends connected to the first and second balanced ends of the acoustic wave filter unit, respectively, and second terminals connected to the first and second balanced terminals, respectively; wherein the acoustic wave resonator includes first and second divided electrode sections obtained by dividing the first bus bar of the IDT electrode of the acoustic wave resonator into two, and the first and second divided electrode sections are connected to each other in series in the acoustic wave propagation direction by the second bus bar;

one terminal of the first divided electrode section which is arranged opposite to the second bus bar is connected to the first signal line;

one terminal of the second divided electrode section which is arranged opposite to the second bus bar is connected to the second signal line;

a length of a line which connects the first divided electrode section to the first balanced end is equal or substantially equal to a length of a line which connects the second divided electrode section to the second balanced end, and the first divided electrode section is different from the second divided electrode section; and an electrode finger pitch of the first divided electrode section is different from an electrode finger pitch of the second divided electrode section.

24. The acoustic wave filter device according to claim 23, wherein, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode is determined to be an electrode finger connected to a ground potential, and the number of electrode fingers included in the first divided electrode section is smaller than the number of electrode fingers included in the second divided electrode section.

25. The acoustic wave filter device according to claim 23, wherein the second bus bar of the acoustic wave resonator is connected to the ground potential.

26. The acoustic wave filter device according to claim 23, wherein a band between a resonant frequency and an anti-resonant frequency of the acoustic wave resonator includes a passband of the longitudinally-coupled resonator type acoustic wave filter unit.

27. The acoustic wave filter device according to claim 23, wherein the longitudinally-coupled resonator type acoustic wave filter unit includes three or more odd number of IDT electrodes which are arranged on the piezoelectric substrate in the acoustic wave propagation direction, among the odd number of IDT electrodes, an IDT electrode arranged in the middle in the acoustic wave propagation direction includes first and second divided IDT sections which are obtained by dividing the IDT electrode into two in the acoustic wave propagation direction, the first and second divided IDT sections include the first and second balanced ends, respectively, and two IDT electrodes arranged so that the IDT electrode in the middle is sandwiched between them.

28. The acoustic wave filter device according to claim 23, wherein the longitudinally-coupled resonator type acoustic wave filter unit includes three or more odd number of IDT electrodes arranged on the piezoelectric substrate in the acoustic wave propagation direction, among the odd number of IDT electrodes, an IDT electrode arranged in the middle in the acoustic wave propagation direction is connected to the unbalanced terminal, and IDT electrodes arranged so that the IDT electrode arranged in the middle is sandwiched between them.

29. The acoustic wave filter device according to claim 23, wherein the longitudinally-coupled acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction, one terminal of an IDT electrode arranged in the middle among the odd number of IDT electrodes included in the first acoustic wave filter unit corresponds to the unbalanced end or the first balanced end, and one end of an IDT electrode and one end of another IDT electrode, the IDT electrodes being arranged so that the IDT electrode arranged in the middle is sandwiched between the IDT electrodes, correspond to the first balanced end or the unbalanced end, and one terminal of an IDT electrode arranged in the middle in the acoustic wave propagation direction among the odd number of IDT electrodes included in the second acoustic wave filter unit corresponds to the unbalanced end or the second balanced end, and one end of an IDT electrode and one end of another IDT electrode, the IDT electrodes being arranged so that the IDT electrode arranged in the middle is sandwiched between the IDT electrodes, correspond to the second balanced end or the unbalanced end.

30. The acoustic wave filter device according to claim 23, wherein the longitudinally-coupled resonator type acoustic wave filter unit includes a first longitudinally-coupled resonator type acoustic wave filter unit including three or more odd number of IDT electrodes arranged on the piezoelectric substrate in the acoustic wave propagation direction, and a second longitudinally-coupled resonator type acoustic wave filter unit including three or more odd number of IDT electrodes arranged on the piezoelectric substrate in the acoustic wave propagation direction, the first and second acoustic wave filter units are arranged so as to be perpendicular or substantially perpendicular to the acoustic wave propagation direction of the acoustic wave filter units and are connected to each other in a two-stage cascade connection, when both sides of each of IDT electrodes arranged in the middle of the first and second acoustic wave filter units are determined to be a first side and a second side, one terminal of an IDT adjacent to the first side of the IDT electrode in the middle of the first acoustic wave filter unit is connected through the first signal line to one terminal of an IDT adjacent to the first side of the second acoustic wave filter unit in the acoustic wave propagation direction, one end of an IDT adjacent to the second side of the IDT electrode arranged in the middle of the first acoustic wave filter unit is connected through the second signal line to one terminal of an IDT electrode adjacent to the second side of the IDT electrode arranged in the middle of the second acoustic wave filter unit, a phase of an electric signal transmitted through the first signal line is different from a phase of an electric signal transmitted through the second signal line, and one terminal of the IDT electrode arranged in the middle of the first acoustic wave filter unit corresponds to the unbalanced end, one terminal of an IDT and one terminal of another IDT, the IDTs being arranged so that the IDT electrode in the middle is sandwiched between the IDTs in the acoustic wave propagation direction, correspond to the first and second balanced ends, and the first and second balanced ends and the first and second balanced terminals are connected to each other through the second acoustic wave filter unit using the first and second signal lines, respectively.

31. The acoustic wave filter device according to claim 30, wherein the acoustic wave resonator is connected to the first and second signal lines in a stage subsequent to the second acoustic wave filter unit.

32. The acoustic wave filter device according to claim 30, wherein the acoustic wave resonator is connected to the first and second signal lines in a stage followed by a stage of the second acoustic wave filter unit and between the first and second acoustic wave filter units.

33. The acoustic wave filter device according to claim 23, wherein, in the longitudinally-coupled resonator type acoustic wave filter unit, when both sides of the IDT electrode arranged in the middle in the acoustic wave propagation direction are determined to be a first side and a second side, in a region including the middle IDT electrode and an IDT electrode adjacent to the middle IDT electrode on the first side, an outermost electrode finger of the IDT electrode which is adjacent to the middle IDT electrode on the first side and which is located near the middle IDT electrode is determined to be an electrode finger connected to a hot potential, and the number of electrode fingers included in the first divided electrode section is larger than the number of electrode fingers included in the second divided electrode section.

* * * * *